US012686818B2

(12) United States Patent (10) Patent No.: US 12,686,818 B2
Miyai et al. (45) Date of Patent: Jul. 21, 2026

(54) HALOPHOSPHATE PHOSPHOR, MANUFACTURING METHOD THEREOF, AND LIGHT-EMITTING DEVICE

(71) Applicant: NICHIA CORPORATION, Anan (JP)

(72) Inventors: Ryuta Miyai, Myozai-gun (JP); Kohei Kunimoto, Anan (JP); Masato Yoshida, Tokushima (JP); Kazuya Nishimata, Anan (JP)

(73) Assignee: NICHIA CORPORATION, Anan (JP)

( * ) Notice: Subject to any disclaimer, the term of this patent is extended or adjusted under 35 U.S.C. 154(b) by 621 days.

(21) Appl. No.: 18/324,113

(22) Filed: May 25, 2023

(65) Prior Publication Data

US 2023/0383183 A1 Nov. 30, 2023

(30) Foreign Application Priority Data

May 27, 2022 (JP) ................................. 2022-086934

(51) Int. Cl.
*C09K 11/77* (2006.01)
*C01B 25/10* (2006.01)
*H10H 20/851* (2025.01)
(52) U.S. Cl.
CPC .......... *C09K 11/7739* (2013.01); *C01B 25/10* (2013.01); *H10H 20/8512* (2025.01); *C01P*

*2002/50* (2013.01); *C01P 2002/72* (2013.01); *C01P 2006/60* (2013.01)
(58) Field of Classification Search
CPC ........................ C09K 11/7739; H10H 20/8512; C01B 25/10; C01P 2002/50; C01P 2002/72; C01P 2006/60
See application file for complete search history.

(56) References Cited

U.S. PATENT DOCUMENTS

| | | | |
|---|---|---|---|
| 5,268,124 | A | 12/1993 | Chau |
| 2013/0076234 | A1 | 3/2013 | Enomoto et al. |

FOREIGN PATENT DOCUMENTS

| | | |
|---|---|---|
| JP | S50-009587 A | 1/1984 |
| JP | H05320638 A | 12/1993 |
| JP | H06206715 A | 7/1994 |
| JP | 2005154500 A | 6/2005 |
| JP | 2009030042 A | 2/2009 |
| JP | 2013072041 A | 4/2013 |
| JP | 2020084107 A | 6/2020 |

*Primary Examiner* — Anita Nassiri-Motlagh
(74) *Attorney, Agent, or Firm* — Hunton Andrews Kurth LLP

(57) ABSTRACT

The halophosphate phosphor includes a halophosphate including an alkaline earth metal including at least calcium; europium; and a halogen including at least chlorine. An elution amount of chlorine ions after the halophosphate phosphor is brought into contact with 10 times by mass of pure water at 85° C. for five hours is 7 ppm or less.

5 Claims, 2 Drawing Sheets

| | |
|---|---|
| PROVIDING HALOPHOSPHATE | S101 |
| ACID-TREATING HALOPHOSPHATE | S102 |
| APPLYING SHEAR FORCE | S103 |
| BRINGING INTO CONTACT WITH LIQUID MEDIUM INCLUDING WATER | S104 |

HALOPHOSPHATE PHOSPHOR, MANUFACTURING METHOD THEREOF, AND LIGHT-EMITTING DEVICE

CROSS-REFERENCE TO RELATED APPLICATIONS

The present application claims priority under 35 U.S.C. § 119 to Japanese Patent Application No. 2022-086934, filed May 27, 2022, the contents of which are hereby incorporated by reference in their entirety.

BACKGROUND

Technical Field

The disclosure relates to a halophosphate phosphor, a method of manufacturing the halophosphate phosphor, and a light-emitting device.

Description of Related Art

Light-emitting devices in which a light-emitting element and a phosphor are combined are utilized in a wide range of fields, such as in illumination, on-board lighting, displays, and liquid crystal backlights, for example. Japanese Patent Publication No. 2009-30042 Patent Document 1 proposes a light-emitting device that uses a halophosphate phosphor including an alkaline earth metal (alkaline earth metal halogen phosphor).

SUMMARY

An object of an aspect of the disclosure is to provide a halophosphate phosphor that, in a light-emitting device that uses a halophosphate phosphor including an alkaline earth metal, can further inhibit a decrease in luminous flux over time, a method of manufacturing the halophosphate phosphor, and a light-emitting device.

A first aspect of the disclosure provides a halophosphate phosphor including a halophosphate. The halophosphate includes: an alkaline earth metal including at least calcium; europium; and a halogen including at least chlorine. The halophosphate phosphor has an elution amount of chlorine ions of 7 ppm or less after being brought into contact with 10 times by mass of pure water at 85° C. for five hours.

A second aspect provides a method of manufacturing a halophosphate phosphor. The method includes: providing a halophosphate including an alkaline earth metal including at least calcium, europium, and a halogen including at least chlorine; acid-treating the halophosphate; and applying a shear force to a first treated product formed in the acid-treating.

A third aspect provides a light-emitting device including a wavelength conversion member including the halophosphate phosphor of the first aspect, and a light-emitting element having a light emission peak wavelength in a range of 400 nm or more and 460 nm or less.

According to an aspect of the disclosure, it is possible to provide a halophosphate phosphor that, in a light-emitting device that uses a halophosphate phosphor including an alkaline earth metal, can further inhibit a decrease in luminous flux over time, a method of manufacturing the halophosphate phosphor, and a light-emitting device.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DESCRIPTION OF EMBODIMENTS

Figure 1:
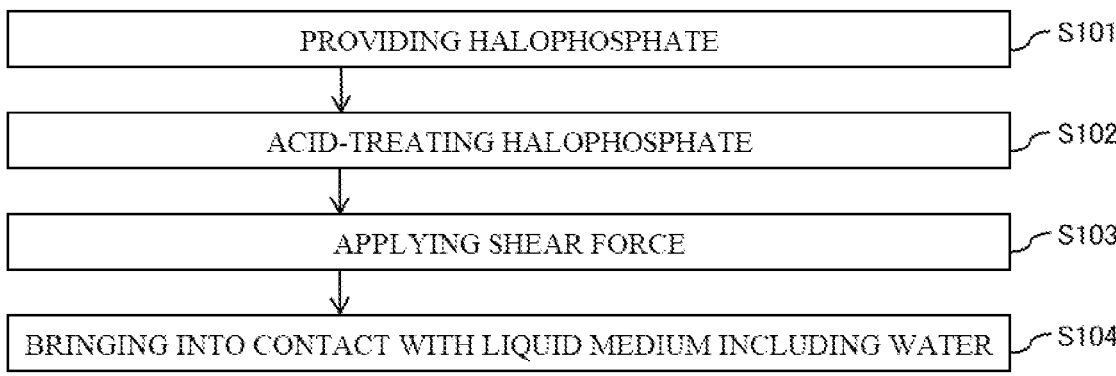
FIG. 1 is a flowchart illustrating an example of a process flow of a method of manufacturing a halophosphate phosphor.

The word "step" herein includes not only an independent step, but also a step that cannot be clearly distinguished from another step provided that the anticipated purpose of the step is achieved. If a plurality of substances applicable to each component in a composition are present, the content of each component in the composition means the total amount of the plurality of substances present in the composition, unless otherwise specified. Furthermore, with respect to an upper limit and a lower limit of numerical ranges described herein, the numerical values exemplified as the numerical range can be freely selected and combined. In the present specification, a plurality of elements separated by commas (,) in a formula representing the composition of the phosphor means that at least one element among the plurality of elements is contained in the composition. In a formula representing the composition of the phosphor, characters preceding the colon (:) represent a host crystal, and characters following the colon (:) represent an activating element. Note that herein, relationships such as the relationship between a color name and a chromaticity coordinate, and the relationship between a wavelength range of light and a color name of monochromatic light are in accordance with JIS Z 8110. The full width at half maximum of a light-emitting element and a phosphor means a wavelength width (full width at half maximum: FWHM) of an emission spectrum at which the emission intensity becomes 50% of the maximum emission intensity in the emission spectrum. Embodiments of the present invention will be described below in detail. However, the embodiments described below are merely examples of a halophosphate phosphor, a method of manufacturing the halophosphate phosphor, and a light-emitting device for embodying the technical concept of the present invention, and the present invention is not limited to the halophosphate phosphor, the method of manufacturing the halophosphate phosphor, and the light-emitting device described below.

Halophosphate Phosphor

The halophosphate phosphor includes a halophosphate including an alkaline earth metal including at least calcium, europium, and a halogen including at least chlorine. The halophosphate phosphor has an elution amount of chlorine ions of 7 ppm or less after being brought into contact with 10 times by mass of pure water at 85° C. for five hours.

With the halophosphate phosphor configured to have a decreased elution amount of chlorine ions after being brought into contact with the pure water, it is possible to further inhibit a decrease in luminous flux over time in a light-emitting device that uses the halophosphate phosphor. The reason for this is considered to be as follows, for example. In a light-emitting device including a halophosphate phosphor, the low content of the chlorine ions included in a water-elutable state in the halophosphate phosphor inhibits the deterioration, caused by the effects of chlorine ions, of resin and other components included in a wavelength conversion member including such a halophosphate phosphor. This is believed to inhibit a decrease in the luminous flux of the light-emitting device over time.

The eluted amount of chlorine ions after the halophosphate phosphor is brought into contact with 10 times by mass of pure water at 85° C. for five hours may be, for example, 7 ppm or less, and preferably 6 ppm or less, 5 ppm or less, 4 ppm or less, 3 ppm or less, or 2 ppm or less. A lower limit of the elution amount may be, for example, 0.1 ppm or greater, 0.5 ppm or greater, or 1 ppm or greater.

The halophosphate phosphor may be composed of a halophosphate including, for example, an alkaline earth metal element including at least calcium and a halogen element including at least chlorine, and may be activated with europium.

The alkaline earth metal included in the halophosphate may be a divalent alkaline earth metal ion. The alkaline earth metal included in the halophosphate includes at least calcium (Ca). The alkaline earth metal may include only calcium, may include at least one selected from the group consisting of strontium (Sr), barium (Ba), and magnesium (Mg) in addition to calcium, or may include at least calcium and strontium. A content of calcium in the alkaline earth metal constituting the halophosphate may be, as a ratio of a number of moles of calcium to a total number of moles of the alkaline earth metal, for example, 0.4 or greater, and preferably 0.6 or greater or 0.8 or greater. A content of calcium and strontium in the alkaline earth metal constituting the halophosphate may be, as a ratio of a total number of moles of calcium and strontium to the total number of moles of the alkaline earth metal, for example, 0.6 or greater, and preferably 0.7 or greater or 0.8 or greater.

The halogen included in the halophosphate may be a monovalent halogen ion. The halogen included in the halophosphate includes at least chlorine (Cl). The halogen may include only chlorine, may include at least one selected from the group consisting of fluorine (F), bromine (Br), and iodine (I) in addition to chlorine, and may include at least one selected from the group consisting of fluorine and bromine in addition to chlorine. A content of chlorine atoms in halogen atoms constituting the halophosphate may be, as a ratio of a number of moles of chlorine atoms to a total number of moles of halogen atoms, for example, 0.3 or greater, and preferably 0.6 or greater or 0.9 or greater. Further, phosphorus atoms constituting the halophosphate may be in the form of an orthophosphate ion ($PO_4^{3-}$) or the like, or may be at least in the form of an orthophosphate ion.

The halophosphate includes europium in its composition. Europium included in the halophosphate may be a divalent europium ion. Europium may be an activator in the halophosphate phosphor. Europium included in the halophosphate may be partially substituted with at least one rare earth element selected from the group consisting of yttrium (Y) and lanthanum (La). In a case in which the halophosphate includes a rare earth element in addition to europium, a content of europium may be, as a ratio of a number of moles of europium to a total number of moles of europium and the rare earth element other than europium, for example, 0.8 or greater, and preferably 0.9 or greater or 0.95 or greater.

The composition of the halophosphate may be such that, given 6 as a number of moles of phosphorus, for example, the number of moles of calcium is in a range of 5.7 or more and 10.1 or less, preferably 6 or more, or 7 or more, and also preferably 10 or less, 9 or less, or 8.5 or less. The composition of the halophosphate may be such that, given 6 as the number of moles of phosphorus, for example, a number of moles of strontium is in a range of 0 or more and 2.1 or less, preferably 0.2 or more, 0.5 or more, or 0.8 or more, and also preferably 2 or less, 1 or less, or 0.9 or less. The composition of the halophosphate may be such that, given 6 as the number of moles of phosphorus, for example, a number of moles of europium is in a range of 0.09 or more and 2.1 or less, preferably 0.1 or more, 0.3 or more, or 0.6 or more, and also preferably 2 or less, 1.5 or less, 1 or less, or 0.9 or less. The composition of the halophosphate may be such that, given 6 as the number of moles of phosphorus, for example, a number of moles of halogen is in a range of 1.9 or more and 2.1 or less, preferably 1.93 or more, or 1.96 or more, and also preferably 2.07 or less, 2.04 or less, or 2 or less.

In one embodiment, the halophosphate may have a composition represented by Formula (1) below.

$$(Ca_{1-x-y}Sr_xEu_y)_z(PO_4)_6Cl_w \tag{1}$$

In Formula (1), x, y, z, and w may satisfy, for example, $0 \leq x \leq 0.21$, $0.009 < y \leq 0.21$, $9 \leq z \leq 11$, and $1.9 \leq w \leq 2.1$. x may preferably satisfy $0.02 \leq x \leq 0.2$ or $0.05 \leq x \leq 0.1$. y may preferably satisfy $0.01 \leq y \leq 0.2$ or $0.03 \leq y \leq 0.15$. z may preferably satisfy $9.4 \leq z \leq 10.4$ or $9.6 \leq z \leq 10.1$. w may preferably satisfy $1.93 \leq w \leq 2.07$ or $1.96 \leq w \leq 2.04$. Cl may be partially substituted with at least one selected from the group consisting of F and Br.

In one embodiment, the halophosphate may have a theoretical composition represented by Formula (1a) below.

$$(Ca,Sr)_{10}(PO_4)_6Cl_2{:}Eu \tag{1a}$$

The halophosphate phosphor may further include a phosphate including europium in addition to the halophosphate. An example of the phosphate including europium includes a europium phosphate (for example, $EuPO_4$).

In a case in which the halophosphate phosphor further includes a phosphate including europium, a content of the phosphate including europium can be evaluated by, for example, an integrated value of diffraction intensity with 2θ corresponding to the phosphate including europium in an X-ray diffraction spectrum in a range of 29° or more and 30° or less. Specifically, the content of the phosphate including europium may be such that, given 100 as a main diffraction intensity of the halophosphate phosphor in an X-ray diffraction spectrum of the halophosphate phosphor, the integrated value of the diffraction intensity in the 2θ range of 29° or more and 30° or less is in a range of 68 or more and 78 or less. The integrated value may be preferably 69 or more, 70 or more, or 72 or more, and may also be preferably 77 or less, 76 or less, or 75 or less. Here, a peak with a maximum diffraction intensity of the halophosphate phosphor may preferably be present in a 2θ range of 30° or more and 33° or less in the X-ray diffraction spectrum. Further, the integrated value of the diffraction intensity may be a total sum of the diffraction intensities corresponding to the resolution of the X-ray diffraction spectrum.

The halophosphate phosphor may have a light emission peak wavelength in a range of 440 nm or more and 480 nm or less in the emission spectrum. The light emission peak wavelength of the halophosphate phosphor may preferably be 445 nm or more or 450 nm or more, and also may preferably be 475 nm or less or 470 nm or less. The halophosphate phosphor may have a half-value width of the emission peak in the emission spectrum in a range of 20 nm or more and 80 nm or less, and preferably 30 nm or more or 60 nm or less. The emission spectrum is measured at room temperature (25° C., for example) at an excitation wavelength of 420 nm.

An emission color of the halophosphate phosphor may be such that a value of x of chromaticity coordinates (x, y) in a chromaticity diagram of the CIE 1931 color system is, for example, in a range of 0.11 or more and 0.18 or less, and preferably 0.12 or more or 0.16 or less. Further, the value of y of the chromaticity coordinates may be, for example, in a range of 0.04 or more and 0.14 or less, and preferably 0.05 or more or 0.12 or less. The chromaticity coordinates are measured at room temperature (25° C., for example) at an excitation wavelength of 420 nm.

A reflectance of the halophosphate phosphor at the wavelength of 420 nm may be, for example, in a range of 2% or more and 30% or less, preferably 3% or more or, 10% or more, and also preferably 20% or less, or 14% or less. The reflectance is measured using a spectrophotometer. For a reference for reflectance, calcium hydrogen phosphate ($CaHPO_4$) is used, for example. That is, the reflectance of the halophosphate phosphor is assumed to be a relative reflectance using calcium hydrogen phosphate as a reference sample and determined.

A mean particle diameter of the halophosphate phosphor may be, for example, in a range of 3 μm or more and 50 μm or less, and preferably 5 μm or more, 8 μm or more, or 10 μm or more, and also preferably 30 μm or less, 20 μm or less, or 15 μm or less. The mean particle diameter of the halophosphate phosphor is measured by the Fischer sub sieve sizer (FSSS) method. The FSSS method is a kind of air permeation method, and is a method in which the flow resistance of air is utilized to measure a specific surface area of a particle and determine a diameter of the particle.

Method of Manufacturing Halophosphate Phosphor

FIG. 1 is a flowchart illustrating an example of a process of a method of manufacturing a halophosphate phosphor. The method of manufacturing a halophosphate phosphor may include providing a halophosphate (S101), acid-treating the halophosphate to form a first treated product (S102), and applying a shear force to the first treated product formed in the acid-treating to form a second treated product (S103). The provided halophosphate may include an alkaline earth metal including at least calcium, europium, and a halogen including at least chlorine. Further, the method of manufacturing a halophosphate phosphor may further include bringing the second treated product into contact with a liquid medium including water (S104).

The method of manufacturing a halophosphate phosphor may include a provision step of providing a halophosphate (hereinafter also referred to as a first halophosphate) including an alkaline earth metal including at least calcium; europium; and a halogen including at least chlorine, an acid treatment step of acid-treating the first halophosphate to form a first treated product, and a dispersing step of applying a shear force to the first treated product formed in the acid treatment step to form a second treated product.

By acid-treating the halophosphate phosphor having a specific composition and then applying a shear force to the halophosphate phosphor, it is possible to manufacture a halophosphate phosphor that can inhibit a decrease in luminous flux over time when the halophosphate phosphor constitutes a light-emitting device. The reason for this is considered to be as follows, for example. Impurities (for example, europium halophosphate) present on the surface of the first halophosphate are removed by the acid treatment, and by-products (for example, europium phosphate), residual acid components, and the like adhere to the surface of the first halophosphate. Applying a shear force to the halophosphate at least partially removes the by-products, residual acid components, and the like. This is conceivably because the elution amount of chlorine ions considered to be derived from the impurities, by-products, residual acid components, and the like can be decreased.

In the provision step, a first halophosphate having a specific composition is provided. The first halophosphate may be provided by procurement, or the first halophosphate having a desired composition may be provided by manufacture. The method of manufacturing the first halophosphate will be described below. The first halophosphate may include an alkaline earth metal, europium, a halogen, and phosphate ions. The details of the alkaline earth metal, the europium, the halogen, and the phosphate ions included in the first halophosphate are the same as those of the alkaline earth metal, the europium, the halogen, and the phosphate ions in the halophosphate phosphor. The first halophosphate may include a phosphor including a halophosphate activated with europium.

The composition of the first halophosphate may be such that, given 6 as the number of moles of phosphorus, for example, the number of moles of calcium is in a range of 5.7 or more and 10.1 or less, preferably 6 or more, or 7 or more, and also preferably 10 or less, 9 or less, or 8.5 or less. The composition of the first halophosphate may be such that, given 6 as the number of moles of phosphorus, for example, the number of moles of strontium is in a range of 0 or more and 2.1 or less, preferably 0.2 or more, 0.5 or more, or 0.8 or more, and also preferably 2 or less, 1 or less, or 0.9 or less. The composition of the first halophosphate may be such that, given 6 as the number of moles of phosphorus, for example, the number of moles of europium is in a range of 0.09 or more and 2.1 or less, preferably 0.1 or more, 0.3 or more, or 0.6 or more, and also preferably 2 or less, 1.5 or less, 1 or less, or 0.9 or less. The composition of the first halophosphate may be such that, given 6 as the number of moles of phosphorus, for example, the number of moles of halogen is in a range of 1.9 or more and 2.1 or less, preferably 1.93 or more, or 1.96 or greater, and also preferably 2.07 or less, 2.04 or less, or 2 or less.

In one embodiment, the first halophosphate has a composition represented by Formula (2) below.

$$(Ca_{1-p-q}Sr_pEu_q)_r(PO_4)_6Cl_s \tag{2}$$

In Formula (2), p, q, r, and s may satisfy, for example, $0 \leq p \leq 0.21$, $0.009 < q \leq 0.21$, $9 \leq r \leq 11$, and $1.9 \leq s \leq 2.1$. p may preferably satisfy $0.02 \leq p \leq 0.2$ or $0.05 \leq p \leq 0.1$. q may preferably satisfy $0.01 \leq q \leq 0.2$ or $0.03 \leq q \leq 0.15$. r may preferably satisfy $9.4 \leq r \leq 10.4$ or $9.6 \leq r \leq 10.1$. s may preferably satisfy $1.93 \leq s \leq 2.07$ or $1.96 \leq s \leq 2.04$. Cl may be partially substituted with at least one selected from the group consisting of F and Br.

In one embodiment, the first halophosphate may have a theoretical composition represented by Formula (2a) below.

$$(Ca,Sr)_{10}(PO_4)_6Cl_2:Eu \tag{2a}$$

In the acid treatment step, the provided first halophosphate is acid-treated to form the first treated product. The first halophosphate can be acid-treated by, for example, bringing the first halophosphate and an acid compound into contact with each other in a liquid medium. In the bringing of the first halophosphate and the acid compound into contact with each other, stirring may be performed, as necessary. A contact temperature of the first halophosphate and the acid compound may be, for example, in a range of 5° C. or more and 80° C. or less, and preferably 15° C. or more or 35° C. or less. A contact period may be, for example, in a range from 1 minute to 120 minutes, and preferably 5 minutes or more or 30 minutes or less. A contact atmosphere may be, for example, an air atmosphere.

The liquid medium need only include at least water, and may further include a water-soluble organic solvent, as necessary, in addition to water. Examples of the water-soluble organic solvent include alcohol solvents such as methanol, ethanol, and propanol, ketone solvents such as acetone and methyl ethyl ketone, and nitrile solvents such as acetonitrile. A content of the water in the liquid medium may be, for example, vol % or more or 50 vol % or more. An amount of the liquid medium used may be, for example, in a range of 2 times or more and 10 times or less by mass of the first halophosphate, and preferably 3 times or more or 6 times or less the mass of the first halophosphate.

Examples of the acid compound include inorganic acids such as hydrogen chloride, nitric acid, phosphoric acid and sulfuric acid, and organic acids such as acetic acid. The acid compound may preferably include at least one selected from the group consisting of hydrogen chloride, nitric acid, acetic acid, phosphoric acid, and sulfuric acid, and may include at least hydrogen chloride. The acid compound in the liquid medium may have a concentration in a range, for example, of 0.1 mass % or more and mass % or less, and preferably in a range of 1 mass % or more or 10 mass % or less.

In the acid treatment step, after the first halophosphate and the acid compound are brought into contact with each other, a cleaning treatment for removing at least a portion of the acid compound adhering to the first halophosphate may be performed, as necessary. The cleaning treatment can be performed by, for example, bringing the first halophosphate having been brought into contact with the acid compound into contact with a liquid medium including water. The details of the liquid medium including water are as described above. A temperature of the cleaning treatment may be, for example, in a range of 5° C. or more and 90° C. or less, and preferably 15° C. or more or 35° C. or less. Further, an amount of the liquid medium used in the cleaning treatment may be, for example, in a range of 50 times or more and 1000 times or less the mass of the first halophosphate, and preferably 100 times or more or 500 times or less the mass of the first halophosphate.

The first treated product formed in the acid treatment step may include the first halophosphate that was acid treated (hereinafter, also referred to as a second halophosphate) and a phosphate including europium disposed on a surface of the first halophosphate. The second halophosphate is generated from the first halophosphate by the acid treatment, and is generated by, for example, removing, from the first halophosphate, components constituting the halophosphate including europium, and the like. The second halophosphate may have substantially the same composition as that of the first halophosphate, and may be a phosphor including a halophosphate activated with europium.

The phosphate including europium constituting the first treated product has a composition different from those of the first and second halophosphates. An example of the phosphates including europium includes a europium phosphate (for example, $EuPO_4$). The phosphate including europium may be physically adhered to the surface of the second halophosphate by van der Waals forces or the like. In the first treated product, a residual acid component including chlorine may be further adhered to the surface of the second halophosphate. An example of the compound including chlorine includes hydrogen chloride (HCl).

In the dispersing step, a shear force is applied to the first treated product formed in the acid-treating of the first halophosphate to form a second treated product. By applying the shear force to the first treated product, it is possible to peel, from the surface of the second halophosphate, at least a portion of the phosphate including europium disposed on the surface of the second halophosphate, for example. Further, applying the shear force makes it possible to remove at least a portion of the compound including chlorine that adheres to the surface of the second halophosphate.

The shear force can be applied to the first treated product by, for example, subjecting the first treated product to a dispersion treatment. The dispersion treatment can be performed by using, for example, a ball mill, a bead mill, or a jet mill. The dispersion treatment may be either a dry dispersion treatment or a wet dispersion treatment, and may include at least a wet dispersion treatment.

For example, in a case in which the dispersion treatment is performed with a ball mill or a bead mill, a resin medium can be used. Examples of the material of the resin medium include urethane resin and nylon resin. By using the resin medium, it is possible to effectively separate the impurities adhered to the surface while inhibiting the pulverization of the particles of the second halophosphate. A size of the resin medium can be, for example, in a range of φ1 mm or more and φ5 mm or less. Further, examples of a material of a shell used in the ball mill or the bead mill include urethane resin and nylon resin. An amount of the resin medium used in the dispersion treatment may be, as a mass ratio with respect to the first treated product, for example, in a range of 0.5 or more and 3 or less, and preferably 1 or more or 2 or less. A dispersion treatment period may be, for example, in a range of 2 hours or more and 48 hours or less, and preferably 10 hours or more or 20 hours or less.

In a case in which the dispersion treatment is performed as a wet dispersion treatment, the liquid medium need only include at least water, and may further include a water-soluble organic solvent, as necessary, in addition to water. A content of the water in the liquid medium may be, for example, 20 vol % or more or 95 vol % or more. An amount of the liquid medium used in the wet dispersion treatment may be, as a mass ratio with respect to the first treated product, for example, in a range of 1 or more to 5 or less, and preferably 2 or more or 3 or less.

In the dispersing step, after the first treated product is subject to the dispersion treatment, the formed dispersion-treated product may be subject to a classification treatment. By performing the classification treatment, it is possible to at least partially remove by-products, residual acid components, and the like separated by the dispersion treatment. The classification treatment can be performed by, for example, stirring, in pure water, the first treated product subjected to the dispersion treatment, precipitating the halophosphate, and then discharging a supernatant liquid. The classification treatment may be performed only once, or may be performed a plurality of times.

The method of manufacturing the halophosphate phosphor may further include a cleaning step of bringing the second treated product formed in the dispersing step into contact with a liquid medium including water to form a third treated product. By bringing the second treated product and the liquid medium including water into contact with each other, it is possible to manufacture a halophosphate phosphor that can more effectively inhibit a decrease in luminous flux over time when constituting a light-emitting device. The cleaning step may include, for example, bringing the second treated product and a liquid medium including water into contact with each other, and at least partially removing the liquid medium from the mixture of the second treated product and the liquid medium.

The second treated product and the liquid medium including water can be brought into contact by mixing the second treated product and the liquid medium. When brought into contact, the second treated product and the liquid medium may be stirred, as necessary. The liquid medium used in the cleaning step need only include at least water, and may further include a water-soluble organic solvent, as necessary, in addition to water. A content of the water in the liquid medium may be, for example, vol % or more or 50 vol % or more, or may be pure water. A used amount of the liquid medium brought into contact with the second treated product in the cleaning step may be, as a mass ratio with respect to the first treated product, for example, in a range of 2 or more and 20 or less, and preferably 5 or more or 10 or less. A contact temperature of the second treated product and the liquid medium may be, for example, in a range of 10° C. or more and 110° C. or less, preferably in a range of 70° C. or more and 100° C. or less, more preferably 75° C. or more or 80° C. or more, and also more preferably or less or 90° C. or less. A contact period may be, for example, in a range of 0.5 hours or more and 48 hours or less, and preferably 1 hour or more or 5 hours or less. A contact atmosphere may be, for example, an air atmosphere.

The liquid medium can be removed from the mixture of the liquid medium and the second treated product by solid-liquid separation of the mixture. Examples of the method of solid-liquid separation include methods commonly used in industrial applications, such as filtration, suction filtration, pressure filtration, centrifugal separation, and decantation. The cleaning step in the method of manufacturing a halophosphate phosphor may be performed only once or may be repeated a plurality of times.

The third treated product formed in the cleaning process may be further subject to a drying treatment. The drying treatment can be performed on the third treated product after the cleaning step under a temperature environment in a range of 90° C. or more and 110° C. or less for a period in a range of 10 hours or more and 24 hours or less, for example.

The third treated product formed in the cleaning step may include a desired halophosphate phosphor. The formed halophosphate phosphor may have an elution amount of chlorine ions of 7 ppm or less after being brought into contact with 10 times mass of pure water at 85° C. for five hours.

The method of manufacturing a halophosphate phosphor may include manufacturing a desired first halophosphate in the provision step. For details of the method of manufacturing the first halophosphate, reference can be made to, for example, JP 2009-30042 A and JP 2020-84107 A.

The method of manufacturing the first halophosphate may include, for example, providing a raw material mixture including each element constituting the composition of the first halophosphate in a desired composition, and heat-treating the provided raw material mixture. The raw material mixture can be prepared by mixing compounds including each element constituting the composition of the first halophosphate. Examples of the compounds constituting the raw material mixture include a compound including an alkaline earth metal including at least calcium, a compound including europium, a compound including phosphorus, and a compound including a halogen including at least chlorine. Examples of the compounds include oxides, carbonates, nitrates, hydroxides, sulfates, acetates, oxalates, hydrogen phosphates, phosphates, and halides such as chlorides. The compounds may also be in the form of hydrates. The compound including an alkaline earth metal and the compound including europium may be oxides, carbonates, or the like, or may be halides, phosphates, or the like as these have favorable stability in air, readily decompose by heating, are less likely to retain elements other than those of the intended composition, and readily inhibits a decrease in emission intensity caused by residual impurity elements.

The raw material mixture can be prepared by weighing and mixing each compound so that, given 6 as a number of moles of phosphorus, the number of moles of calcium is in a range of 5.7 or more and 10.1 or less, the number of moles of strontium is in a range of 0 or more and 2.1 or less, the number of moles of europium is in a range of 0.09 or more and 2.1 or less, and the number of moles of halogen is in a range of 2.0 or more and 4.5 or less. Examples of the mixing method include a wet or dry mixing method using a mixer. As the mixer, in addition to a ball mill commonly used in industrial applications, a grinder such as a vibration mill, a roll mill, or a jet mill can be used. The raw material compound can be increased in specific surface area by grinding. Further, the raw material can also be classified by using a wet separator such as a settling tank, a hydrocyclone, or a centrifugal separator, or a dry classifier such as a cyclone or an air separator that are commonly used in industrial applications to achieve a certain range of a specific surface area of the particles.

The raw material mixture may include flux. With the raw material mixture including flux, the reaction with the raw material compounds is further promoted and the solid-phase reaction proceeds more uniformly, making it possible to form a heat-treated product having a large particle size. For example, in a case in which the heat treatment is performed in a temperature range of 1000° C. or more and 1300° C. or less and a halide or the like is used as the flux at a temperature in this range, the temperature is substantially the same as the generation temperature of the liquid phase of the halide, conceivably making the solid-phase reaction between the raw materials proceed more uniformly. As the halide used as the flux, chlorides and fluorides of rare earth metals and alkali metals and the like can be utilized. The flux may be added as a portion of the raw materials of the first halophosphate by adjusting the element ratio of cations included in the flux to form a desired composition of the heat-treated product, or the flux may be added by adding each raw material compound to form a desired composition of the heat-treated product and then further adding the flux.

In a case in which the raw material mixture includes flux, a content of the flux in the raw material mixture may be, for example, 10 mass % or less, and preferably 5 mass % or less. When the content of the flux is within the range described above, a decrease in the luminous efficiency of the formed first halophosphate tends to be inhibited.

A heat treatment temperature of the raw material mixture may be, for example, in a range of 1000° C. or more and 1300° C. or less, and preferably 1100° C. or more or 1250° C. or less. When the heat treatment temperature is within the range described above, decomposition of the heat-treated product tends to be effectively inhibited, making it possible to form the desired first halophosphate phosphor. The heat treatment may be performed by a primary heat treatment and then a secondary heat treatment, or a plurality of heat treatments may be further repeated.

A heat treatment period for a single heat treatment may be, for example, in a range of 1 hour or more and 30 hours or less. The raw material mixture may be heat-treated by changing the heat treatment temperature in stages in a single heat treatment. For example, the heat treatment of a first stage may be performed at a temperature in a range of 800° C. or more and less than 1000° C., and the heat treatment of the following second stage may be performed at an increased temperature in a range of 1000° C. or more and 1300° C. or less.

The raw material mixture may be heat-treated in a non-oxidizing atmosphere, and preferably in a reducing atmosphere. Specifically, the atmosphere may be a nitrogen atmosphere, a mixed atmosphere of nitrogen and hydrogen, an ammonia atmosphere, or a mixed atmosphere thereof (for example, a mixed atmosphere of nitrogen and ammonia). With the heat treatment performed in a reducing atmosphere, a reactivity of the raw material mixture is improved, and thus a mixed atmosphere of nitrogen and hydrogen having a high reducing power is preferred. Further, the reducing atmosphere may be solid carbon based atmosphere in an air atmosphere.

In the heat-treated product formed in an atmosphere having a high reducing power, the content ratio of the divalent europium ($Eu^{2+}$) included in the heat-treated product tends to increase, making it possible to further increase the emission intensity. The divalent europium included in the raw material mixture readily oxidizes into trivalent europium. However, with the raw material mixture heat-treated in a reducing atmosphere having a high reducing power, the trivalent europium included in the heat-treated product is readily reduced into divalent europium. Therefore, the content ratio of the divalent europium included in the heat-treated fired product increases, making it possible to manufacture the first halophosphate having a higher emission intensity.

In the method of manufacturing the first halophosphate, the heat-treated product may be subject to post-treatment such as washing, pulverization, dispersion, solid-liquid separation, and drying. Solid-liquid separation can be performed by methods commonly used in industrial applications, such as filtration, suction filtration, pressure filtration, centrifugal separation, and decantation. Drying can be performed using a device commonly used in industrial applications, such as a vacuum dryer, a hot air heating dryer, a conical dryer, or a rotary evaporator. The heat-treated product may be subject to post-treatment, as necessary, to manufacture the first halophosphate in powder form.

Light-Emitting Device

A light-emitting device includes a wavelength conversion member including the halophosphate phosphor, and a light-emitting element having a light emission peak wavelength in a range of 400 nm or more and 460 nm or less. The wavelength conversion member includes the halophosphate phosphor having an elution amount of chlorine ions of 7 ppm or less after being brought into contact with 10 times by mass of pure water at 85° C. for five hours, making it possible to inhibit a decrease in luminous flux over time when constituting a light-emitting device.

Figure 2:
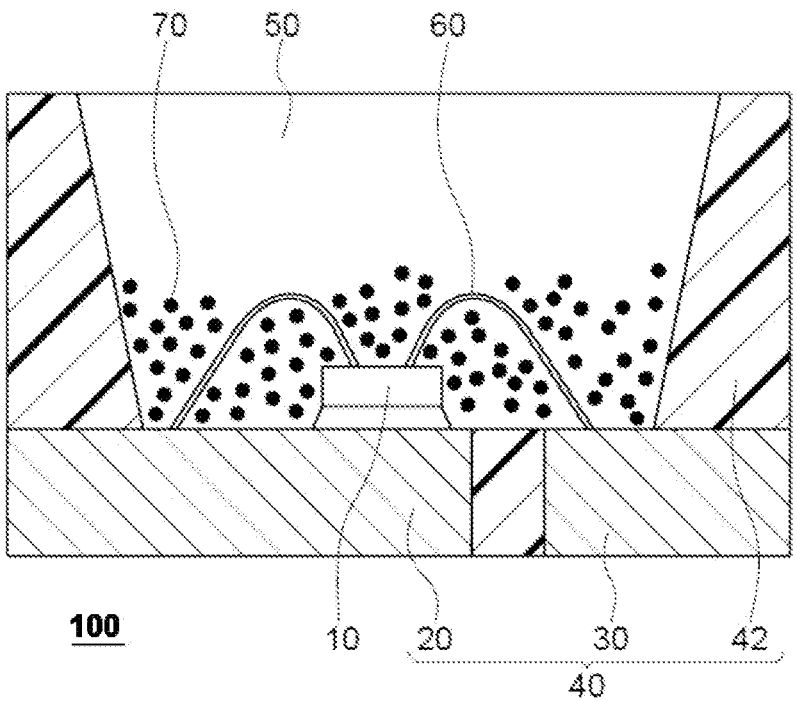
FIG. 2 is a schematic cross-sectional view illustrating an example of a light-emitting device.

An example of the light-emitting device will be described on the basis of the drawings. FIG. 2 is a schematic cross-sectional view illustrating an example of a light-emitting device. A light-emitting device 100 includes a molded body 40 including a recessed portion, a light-emitting element 10 serving as a light source, and a wavelength conversion member 50 covering the light-emitting element 10. The molded body 40 is formed by integrally molding a first lead 20, a second lead 30, and a resin product 42 including a thermoplastic resin or a thermosetting resin. The molded body 40 has a recessed portion including a bottom surface and a lateral surface, and the light-emitting element 10 is mounted on the bottom surface of the recessed portion. The light-emitting element 10 includes a pair of positive and negative electrodes, and the pair of the positive and negative electrodes are electrically connected to the first lead 20 and the second lead 30, respectively, via wires 60. The light-emitting element 10 is covered with the wavelength conversion member 50. The wavelength conversion member 50 includes, for example, a phosphor 70 that converts a wavelength of light from the light-emitting element 10, and a resin. The wavelength conversion member 50 not only has a wavelength conversion function but also functions as a member for protecting the light-emitting element 10 and the phosphor 70 from the external environment. The light-emitting device 100 receives a power supply from the outside via the first lead 20 and the second lead, and thus emits light.

Figure 3:
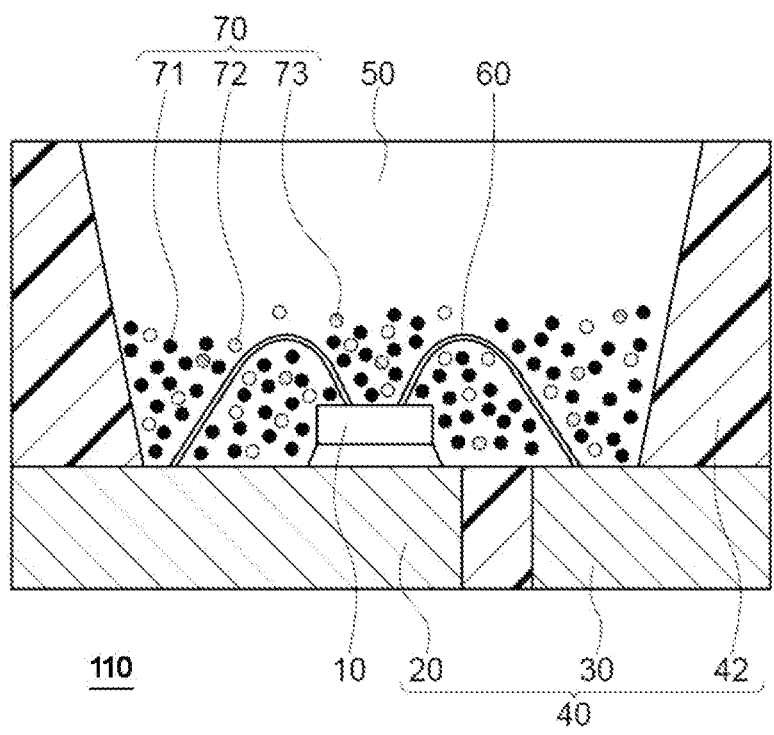
FIG. 3 is a schematic cross-sectional view illustrating another example of a light-emitting device.

FIG. 3 is a schematic cross-sectional view illustrating another example of a light-emitting device. In a light-emitting device 110, the wavelength conversion member 50 is configured to include, as the phosphor 70, at least three types of phosphors of a first phosphor 71, a second phosphor 72, and a third phosphor 73.

The light emission peak wavelength of the light-emitting element is in a range of 400 nm or more and 460 nm or less, and preferably in a range of 400 nm or more and 440 nm or less from the viewpoint of emission efficiency. A light-emitting device that emits mixed light of light from the light-emitting element and fluorescent light from the phosphors can be configured by using, as an excitation light source, a light-emitting element having a light emission peak wavelength in this range. Further, the light exiting from the light-emitting element to the outside can be effectively utilized, and thus the loss of light exiting from the light-emitting device can be reduced and a highly efficient light-emitting device can be achieved.

The half-value width of the emission spectrum of the light-emitting element may be, for example, 30 nm or less. A semiconductor light-emitting element, such as a light-emitting diode (LED), is preferably used as the light-emitting element. By using a semiconductor light-emitting element as a light source, it is possible to achieve a stable light-emitting device that exhibits high efficiency and high output linearity with respect to an input and that is strong against mechanical impact. As the semiconductor light-emitting element, a semiconductor light-emitting element that emits blue light, green light, or the like using a nitride-based semiconductor ($In_XAl_YGa_{1-X-Y}N$, where X and Y satisfy $0 \leq X$, $0 \leq Y$, $X+Y \leq 1$) can be used, for example.

The wavelength conversion member can include, for example, a phosphor and a resin. The wavelength conversion member may include, as the phosphor, at least one first phosphor, at least one second phosphor, and at least one third phosphor that absorb light emitted from the light-emitting element and emit blue light, green light, and red light, respectively. The first, second and third phosphors have compositions different from one another. By selecting, as appropriate, the composition ratio of the first, second and third phosphors, it is possible to set characteristics, such as the emission efficiency of the light-emitting device and the chromaticity coordinates of the emitted light, in desired ranges.

Examples of the resin constituting the wavelength conversion member include a silicone resin, an epoxy resin, a modified silicone resin, a modified epoxy resin, and an acrylic resin. For example, a refractive index of the silicone resin may be in a range from 1.35 to 1.55, and more preferably in a range of 1.38 or more and 1.43 or less. When the refractive index of the silicone resin is within these ranges, the silicone resin has excellent transmissivity and can be suitably used as a resin constituting the wavelength conversion member. Here, the refraction index of the silicone resin is a refractive index after being cured, and is measured in accordance with JIS K 7142:2008. The wavelength conversion member may further include a light-diffusing material in addition to the resin and the phosphor. When a light-diffusing material is included, directivity from the light-emitting element can be alleviated, and a viewing angle can be increased. Examples of the light-diffusing material include silicon oxide, titanium oxide, zinc oxide, zirconium oxide, and aluminum oxide.

The wavelength conversion member may include a halophosphate phosphor as the first phosphor, and may further include the second phosphor and third phosphor each having a light emission peak wavelength range different from that of the first phosphor. The content of the first phosphor in the wavelength conversion member may be, relative to 100 parts by mass of the resin included in the wavelength conversion member, for example, in a range of 2 parts by mass or more and 250 parts by mass or less, preferably 10 parts by mass or more, and also preferably 200 parts by mass or less or 180 parts by mass or less.

The wavelength conversion member may further include the second phosphor having a light emission peak wavelength in a range of 500 nm or more and 600 nm or less. The second phosphor may include at least one phosphor selected from the group consisting of a β-sialon phosphor, a rare earth aluminate phosphor, a halogen silicate phosphor, an alkaline earth metal silicate phosphor, and a sulfide phosphor. The wavelength conversion member may include one type of the second phosphor alone, or may include two or more types in combination.

The β-sialon phosphor may have a theoretical composition represented by Formula (IIa) below, for example.

$$Si_{6-q}Al_qO_qN_{8-q}:Eu \tag{IIa}$$

In Formula (IIa), q may be a number satisfying $0 < q < 4.2$.

The rare earth aluminate phosphor may have a theoretical composition represented by Formula (IIb) below.

$$Ln_3Al_{5-p}Ga_pO_{12}:Ce \tag{IIb}$$

In Formula (IIb), Ln may include at least one element selected from the group consisting of Y, Lu, Gd, and Tb, and p may be a number satisfying $0 \le p \le 3$.

The halogen silicate phosphor may have a theoretical composition represented by Formula (IIc) below.

$$M^1_8MgSi_4O_{16}Hal_2:Eu \tag{IIc}$$

In Formula (IIc), $M^1$ may include at least one element selected from the group consisting of Ca, Sr, Ba, and Zn. The Hal may include at least one element selected from the group consisting of F, Cl, Br, and I.

The alkaline earth metal silicate phosphor may have a theoretical composition represented by Formula (IId) below.

$$M^2_2SiO_3:Eu \tag{IId}$$

In Formula (IId), $M^2$ may include at least one element selected from the group consisting of Ba, Sr, Ca, and Mg.

The sulfide phosphor may have a theoretical composition represented by Formula (IIe) below.

$$M^3Ga_2S_4:Eu \tag{IIe}$$

In Formula (IIe), $M^3$ may include at least one element selected from the group consisting of BA, Sr, and Ca.

A content of the second phosphor in the wavelength conversion member may be, relative to 100 parts by mass of the resin included in the wavelength conversion member, for example, in a range of 1 parts by mass or more and 150 parts by mass or less, preferably 2 parts by mass or more, and also preferably 100 parts by mass or less or 50 parts by mass or less.

The wavelength conversion member may further include the third phosphor having a light emission peak wavelength in a range of 620 nm or more and 670 nm or less. The third phosphor may include at least one phosphor selected from the group consisting of a fluoride phosphor, a germanate phosphor, a nitride phosphor, and a sulfide phosphor. The wavelength conversion member may include one type of the third phosphor alone, or may include two or more types in combination.

The fluoride phosphor may have a theoretical composition represented by Formula (IIIa) or (IIIb) below.

$$A^1_b[M^4_{1-a}Mn_aFc] \tag{IIIa}$$

In Formula (IIIa), $A^1$ may include at least one element selected from the group consisting of an alkali metal and ammonium. The alkali metal may include at least one selected from the group consisting of Li, Na, K, Rb, and Cs. $M^4$ includes at least one of Si and Ge, and may further include at least one element selected from the group consisting of Group 4 elements and Group 14 elements. Mn may be a tetravalent Mn ion. a may be a number satisfying $0 < a < 0.2$. b is an absolute value of the charge of the $[M^4_{1-a}Mn_aF_c]$ ion, and may be a number satisfying $1.8 \le b \le 1.2$. c may be a number satisfying $5 < c < 7$.

$$A^2_e[M^5_{1-d}Mn_dF_f] \tag{IIIb}$$

In Formula (IIIb), $A^2$ may include at least one element or ion selected from the group consisting of an alkali metal and ammonium. The alkali metal may include at least one selected from the group consisting of Li, Na, K, Rb, and Cs. $M^5$ includes at least Si and Al, and may further include at least one element selected from the group consisting of Group 4 elements, Group 13 elements, and Group 14 elements. Mn may be a tetravalent Mn ion. d may be a number satisfying $0<d<0.2$. e is the absolute value of the charge of the $[M^4_{1-d}Mn_dF_f]$ ion and may be a number satisfying $1.8 \leq e \leq 1.2$. f may be a number satisfying $5<f<7$.

The germanate phosphor may have a theoretical composition represented by Formula (IIIc) below.

$$(i-j)MgO \bullet (j/2)Sc_2O_3 \bullet kMgF_2 \bullet mCaF_2 \bullet (1-n)GeO_2 \bullet (n/2)M^6_2O_3 : uMn \qquad (IIIc)$$

In Formula (Mc), $M^6$ may include at least one element selected from the group consisting of Al, Ga, and In. i, j, k, m, n, and v may be numbers satisfying $2 \leq i \leq 4$, $0 \leq k \leq 1.5$, $0 \leq u \leq 0.05$, $0 \leq j \leq 0.5$, $0 \leq m \leq 1.5$, and $0 \leq n \leq 0.5$.

The nitride phosphor may include at least one phosphor selected from the group consisting of phosphors having a theoretical composition represented by Formula (IIId), Formula (IIIe), or Formula (IIIf) below.

$$(Ca_{1-b-c}Sr_bEu_c)AlSiN_3 \qquad (IIId)$$

$$M^7_dM^8_eM^9_fAl_{3-g}Si_gN_h \qquad (IIIe)$$

$$(Ca_{1-s-t-v}Sr_sBa_tEu_v)_2Si_5N_8 \qquad (IIIf)$$

In Formula (IIId), b and c may be numbers satisfying $0 \leq b \leq 1.0$, $0<c<1.0$, and $b+c<1.0$. In Formula (IIIe), $M^7$ may include at least one element selected from the group consisting of Ca, Sr, and Ba. $M^8$ may include at least one element selected from the group consisting of Li, Na, and K. $M^9$ may include at least one element selected from the group consisting of Eu, Ce, Tb, and Mn. d, e, f, g, and h may be numbers satisfying $0.80 \leq d \leq 1.05$, $0.80 \leq e \leq 1.05$, $0.001 \leq f \leq 0.1$, $0 \leq g \leq 0.5$, and $3.0 \leq h \leq 5.0$, respectively. In the Formula (IIIf), s, t and v may be numbers satisfying $0 \leq s \leq 1.0$, $0 \leq t \leq 1.0$, and $0 \leq v \leq 1.0$, respectively, and $s+t+v \leq 1.0$.

The sulfide phosphor may have a theoretical composition represented by Formula (IIIg) below.

$$(Ca_{1-u}Sr_u)S:Eu \qquad (IIIg)$$

In Formula (IIIg), u may be a number satisfying $0 \leq u \leq 1.0$.

A content of the third phosphor in the wavelength conversion member may be, relative to 100 parts by mass of the resin included in the wavelength conversion member, for example, in a range of 1 parts by mass or more and 150 parts by mass or less, preferably 2 parts by mass or more, and also preferably 100 parts by mass or less or 50 parts by mass or less.

A total content of the phosphor in the wavelength conversion member may be, relative to 100 parts by mass of the resin, for example, in a range of 5 parts by mass or more and 300 parts by mass or less, preferably 10 parts by mass or more or 15 parts by mass or more, and also preferably 250 parts by mass or less, 230 parts by mass or less, or 200 parts by mass or less. When the total content of the phosphor in the wavelength conversion member is within the ranges described above, a decrease in the emission efficiency of the light-emitting device can be more effectively inhibited.

The present disclosure may encompass the following aspects.

[1] A halophosphate phosphor including a halophosphate including an alkaline earth metal including at least calcium, europium, and a halogen including at least chlorine, wherein an elution amount of chlorine ions after the halophosphate phosphor is brought into contact with 10 times by mass of pure water at 85° C. for five hours is 7 ppm or less.

[2] The halophosphate phosphor according to [1] further including a phosphate including europium, wherein given 100 as a maximum diffraction intensity of the halophosphate phosphor in an X-ray diffraction spectrum, an integrated value of diffraction intensity in a $2\theta$ range of 29° or more and 30° or less is in a range of 68 or more and 78 or less.

[3] The halophosphate phosphor according to [1] or [2], wherein the halophosphate has a composition such that, given 6 as a number of moles of phosphorus, a number of moles of calcium is in a range of 5.7 or more and 10.1 or less, a number of moles of strontium is in a range of 0 or more and 2.1 or less, a number of moles of europium is in a range of 0.09 or more and 2.1 or less, and a number of moles of halogen is in a range of 1.9 or more and 2.1 or less.

[4] The halophosphate phosphor according to any one of [1] to [3], wherein the halophosphate has a composition represented by Formula (1):

$$(Ca_{1-x-y}Sr_xEu_y)_z(PO_4)_6Cl_w \qquad (1)$$

where x, y, z, and w satisfy $0 \leq x \leq 0.21$, $0.009<y \leq 0.21$, $9 \leq z \leq 11$, and $1.9 \leq w \leq 2.1$, and Cl may be partially substituted with at least one selected from the group consisting of F and Br.

[5] A method of manufacturing a halophosphate phosphor, the method including providing a halophosphate including an alkaline earth metal including at least calcium, europium, and a halogen including at least chlorine, acid-treating the halophosphate, and applying a shear force to a first treated product formed in the acid-treating.

[6] The method of manufacturing a halophosphate phosphor according to [5], wherein the acid-treating includes bringing the halophosphate and an acid compound into contact with each other in a liquid medium.

[7] The method of manufacturing a halophosphate phosphor according to [6], wherein the acid-treating further includes removing at least a portion of the acid compound after bringing the halophosphate and the acid compound into contact with each other.

[8] The method of manufacturing a halophosphate phosphor according to [6] or [7], wherein, in the acid treatment, the acid compound includes at least one selected from the group consisting of hydrogen chloride, nitric acid, acetic acid, phosphoric acid, and sulfuric acid.

[9] The method of manufacturing a halophosphate phosphor according to any one of [5] to [8], wherein the applying of the shear force includes a wet dispersion treatment.

[10] The method of manufacturing a halophosphate phosphor according to [9], wherein the application of the shear force further includes a classification treatment after the wet dispersion treatment.

[11] The method of manufacturing a halophosphate phosphor according to any one of [5] to [10], further including bringing a second treated product into contact with a liquid medium including water, the second treated product being formed in the applying of the shear force to the first treated product.

[12] The method of manufacturing a halophosphate phosphor according to [11], wherein the second treated product is brought into contact with the liquid medium at a temperature in a range of 70° C. or more and 100° C. or less.

[13] The method of manufacturing a halophosphate phosphor according to any one of [5] to [12], wherein, in the applying of the shear force, the first treated product including halophosphate and phosphate including europium.

[14] The method of manufacturing a halophosphate phosphor according to any one of [5] to [13], wherein the halophosphate phosphor has an elution amount of chlorine ions of 7 ppm or less after being brought into contact with 10 times by mass of pure water at 85° C. for five hours.

[15] The method of manufacturing a halophosphate phosphor according to any one of [5] to [14], wherein, in the providing of the halophosphate, the halophosphate has a composition such that, given 6 as a number of moles of phosphorus, a number of moles of calcium is in a range of 5.7 or more and 10.1 or less, a number of moles of strontium is in a range of 0 or more and 2.1 or less, a number of moles of europium is in a range of 0.09 or more and 2.1 or less, and a number of moles of halogen is in a range of 1.9 or more and 2.1 or less.

[16] The method of manufacturing a halophosphate phosphor according to any one of [5] to [15], wherein, in the providing of the halophosphate, the halophosphate has a composition represented by Formula (1):

$$(Ca_{1-x-y}Sr_xEu_y)_z(PO_4)_6Cl_w \quad (1)$$

where x, y, z, and w satisfy $0 \leq x \leq 0.21$, $0.009 < y \leq 0.21$, $9 \leq z \leq 11.2$, and $1.9 \leq w \leq 2.1$, and Cl may be partially substituted with at least one selected from the group consisting of F and Br)

A light-emitting device including a wavelength conversion member including the halophosphate phosphor described in any one of [1] to [4], and a light-emitting element having a light emission peak wavelength in a range of 400 nm or more and 460 nm or less.

EXAMPLES

The present invention will be described in detail below by using examples, but the present invention is not limited to these examples.

Manufacturing Example

As raw materials, $CaCO_3$, $SrCO_3$, $Eu_2O_3$, $(NH_4)_2HPO_4$, and $NH_4Cl$ were used. These raw materials were weighed so that, given 6 as a molar ratio of phosphorus (P), a molar ratio of each element was Ca:Sr:Eu:P:Cl=8.1:1:0.9:6:3.5. Subsequently, these raw materials were mixed in a ball mill. The mixed raw materials were heat-treated in a reducing atmosphere at a temperature in a range of 1000° C. or more and 1200° C. or less for a period in a range from 2 hours to 5 hours, thereby obtaining a heat-treated product. The heat-treated product was subjected to wet dispersion and classification treatments, thereby a first halophosphate A including calcium, strontium, europium, and chlorine was obtained.

Example 1

1000 g of the first halophosphate A formed in Manufacturing Example were added to 4000 g of 1 mass % hydrochloric acid, and the mixture was stirred for 10 minutes. After the stirring, solid-liquid separation was performed followed by cleaning using pure water to obtain a first treated product A1 after acid treatment.

800 g of 3-mm diameter resin beads and 1600 g of pure water were added to 800 g of the first treated product A1, and the mixture was subjected to wet dispersion treatment for 18 hours by a bead mill. Subsequently, classification treatment was performed by sedimentation classification to obtain, as a second treated product A2, the halophosphate phosphor of Example 1.

Example 2

500 g of the second treated product A2 obtained in example 1 were added to 5000 g of pure water at 85° C., and the mixture was stirred for 2 hours and then cleaned twice in total to obtain a halophosphate phosphor of Example 2.

Comparative Example 1

The first halophosphate A obtained in the manufacturing example was used as a halophosphate phosphor of Comparative Example 1.

Comparative Example 2

The first treated product A1 after acid treatment obtained in Example 1 was used as a halophosphate phosphor of Comparative Example 2.

Comparative Example 3

50 g of the first halophosphate A obtained in the manufacturing example were added to 500 g of pure water at 85° C., the mixture was stirred for 2 hours and then cleaned twice in total to obtain a halophosphate phosphor of Comparative Example 3.

Measurement of Mean Particle Diameter

A mean particle diameter of each halophosphate phosphor obtained as described above was measured by the Fischer sub sieve sizer (FSSS) method. The results are shown in Table 1.

Measurement of Optical Characteristics

Optical characteristics of each halophosphate phosphor obtained as described above were measured. The optical characteristics were measured as light emission characteristics at room temperature (25° C.±5° C.) by irradiating each phosphor with light having a 420 nm wavelength as the excitation light using a spectrofluorometer (product name: F-4500, Hitachi High-Tech Corporation). The results are shown in Table 1. The emission intensity is shown as a relative emission intensity given 100% as the emission intensity of the halophosphate phosphor of Comparative Example 1. Further, reflectance was measured by using calcium hydrogen phosphate ($CaHPO_4$) as a reference (100%).

Composition Analysis

The composition of each halophosphate phosphor obtained as described above was analyzed. The molar ratio of each element of Ca, Sr, Eu, and P in the halophosphate phosphor was measured by using an inductively coupled plasma-atomic emission spectrometer (ICP-AES) (product name: Optima 8300, manufactured by Ikeda Scientific Co., Ltd.). Further, the molar ratio of the Cl element in each halophosphate phosphor was measured by using a potentiometric titrator (product name: AT-5000, manufactured by Kyoto Electronics Manufacturing Co., Ltd.). The composition ratio of each element of the phosphor was calculated on the basis of 6 being the molar ratio of P. The results are shown in Table 1.

Measurement of X-Ray Diffraction (XRD)

An X-ray diffraction pattern of each halophosphate phosphor obtained as described above was measured. With an X-ray diffractometer (device name: Ultima IV, manufactured by Rigaku Corporation), a $CuK\alpha$ beam was used to perform the measurement.

In the measured XRD pattern, given 100 as an intensity of a maximum diffraction peak ($2\theta$ being in a range of 30° or more and 33° or less) of the halophosphate phosphor, the integrated value (XRD integrated value) of the diffraction intensity in a $2\theta$ range of 29° or more and 30° or less corresponding to the maximum diffraction peak of europium phosphate was calculated. The results are shown in Table 1.

Elution Test

Each halophosphate phosphor obtained as described above was stored in 10 times by mass of pure water at 85° C. for five hours, and then analyzed for chlorine ions (ppm) as an eluted element of a supernatant solution. The same device as in the composition analysis described above was used for analysis. The results are shown in Table 1.

the integrated value of the diffraction intensity in the $2\theta$ range of 29° or more and 30° or less, in the halophosphate phosphor of Comparative Example 2, the amount of the by-product (europium phosphate) generated and adhered to the surface of the halophosphate phosphor when the halophosphate was brought into contact with the acid solution is larger than those of the halophosphate phosphors of the other example and Comparative Examples. Some of this byproduct (europium phosphate) conceivably inhibited the light emission of the halophosphate phosphor, resulting in the lower emission intensity of the halophosphate phosphor in Comparative Example 2.

Example of Manufacturing Light-Emitting Device

Figure 4:
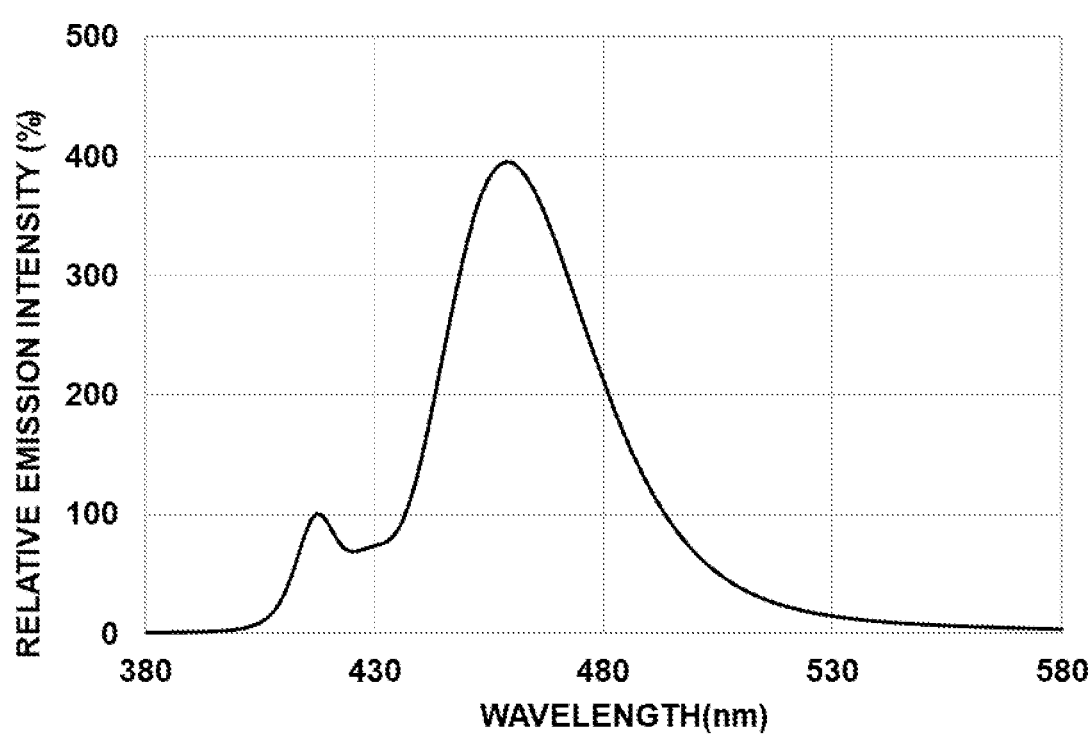
FIG. 4 is an example of an emission spectrum of a light-emitting device that uses the halophosphate phosphor according to Example 1.

Only the halophosphate phosphors obtained in examples 1 and 2 and Comparative Examples 1 to 3 described above were used as the phosphors, and nitride semiconductor light-emitting elements having light emission peak wavelengths of 417 nm were used as the light-emitting elements. The light-emitting devices of Manufacturing Examples 1 and 2 and the light-emitting devices of the Comparative Manufacturing Examples 1 to 3 were each manufactured by adjusting the content of each halophosphate phosphor with respect to the silicone resin and forming each wavelength conversion member so that the emission intensity of the emission peak of the halophosphate phosphor was four times the intensity of the light-emitting element. Table 2 shows the content (mass %) of the halophosphate phosphor relative to the silicone resin. Further, FIG. 4 shows the emission spectrum of the light-emitting device of Manufacturing Example 1. In FIG. 4, the emission spectrum is shown with the vertical axis representing the relative emission intensity given 100% as the emission intensity at the light emission peak wavelength of the light-emitting element.

The total luminous flux of each manufactured light-emitting device was measured using the values of x and y of the chromaticity coordinates (x, y) and an integrating sphere. The relative luminous flux was determined given 100% as the luminous flux of the light-emitting device of Compara-

TABLE 1

| | Mean particle diameter | Chromaticity coordinates | | Relative emission intensity | Reflectance | Composition ratio (P = 6.0) | | | | XRD integrated value | Chlorine ions |
|---|---|---|---|---|---|---|---|---|---|---|---|
| Emission characteristics (Ex = 420 nm) | | | | | | | | | | | |
| | (μm) | x | y | (%) | (%) | Ca | Sr | Eu | Cl | value | (ppm) |
| Example 1 | 11.0 | 0.139 | 0.082 | 99.8 | 13.3 | 8.17 | 0.85 | 0.79 | 1.97 | 74.4 | 4.0 |
| Example 2 | 11.0 | 0.139 | 0.083 | 100.1 | 12.3 | 8.17 | 0.85 | 0.79 | 1.97 | 73.4 | 2.0 |
| Comparative example 1 | 12.0 | 0.139 | 0.082 | 100.0 | 13.4 | 8.24 | 0.84 | 0.74 | 1.99 | 67.1 | 8.0 |
| Comparative example 2 | 10.0 | 0.139 | 0.082 | 97.7 | 14.3 | 8.11 | 0.84 | 0.80 | 1.97 | 79.1 | 10.0 |
| Comparative example 3 | 11.0 | 0.139 | 0.082 | 100.2 | 13.8 | 8.24 | 0.84 | 0.74 | 1.99 | 66.4 | 9.0 |

Table 1 shows that the halophosphate phosphors of examples 1 and 2 have decreased eluted chlorine ions compared to those of the halophosphate phosphors of Comparative Examples 1 to 3. From these results, it is thought that the elution of chlorine ions was inhibited by the process of bringing the sample into contact with the acid solution and the process of bringing the sample into contact with the high temperature aqueous solution. The halophosphate phosphor of Comparative Example 2 has a lower emission intensity compared to those of the halophosphate phosphors of other examples and the Comparative Examples. The reason for this is considered to be as follows. According to tive Manufacturing Example 1, which is based on the halophosphate phosphor of Comparative Example 1. Table 2 shows the results.

Durability Evaluation

Each manufactured light-emitting device was subjected to a continuous lighting test at a current of 150 mA in an environmental testing machine at 85° C., a storage test in an environmental testing machine at 85° C. and 85% RH, and a durability test after the elapse of 500 hours. Given 100% as the initial luminous flux of each light-emitting device before the durability test, the luminous flux maintenance rate (%) of the light-emitting device after the durability test was calculated. Table 2 shows the results.

TABLE 2

| Light-emitting device | Phosphor | Phosphor content (mass %) | Initial characteristics Chromaticity coordinates x | Initial characteristics Chromaticity coordinates y | Relative luminous flux (%) | Luminous flux maintenance ratio (%) 85° C. 150 mA | Luminous flux maintenance ratio (%) 85° C. 85% RH |
|---|---|---|---|---|---|---|---|
| Manufacturing example 1 | Example 1 | 55 | 0.142 | 0.075 | 99.7 | 96.7 | 99.3 |
| Manufacturing example 2 | Example 2 | 55 | 0.142 | 0.075 | 100.2 | 99.4 | 99.7 |
| Comparative manufacturing example 1 | Comparative example 1 | 56 | 0.142 | 0.075 | 100.0 | 95.6 | 97.0 |
| Comparative manufacturing example 2 | Comparative example 2 | 55 | 0.142 | 0.075 | 97.2 | 95.0 | 97.3 |
| Comparative manufacturing example 3 | Comparative example 3 | 56 | 0.142 | 0.075 | 99.9 | 95.6 | 97.4 |

Table 2 shows that, compared to the light-emitting devices based on the halophosphate phosphors according to Comparative Examples 1 to 3 in which the elution of chlorine ions was not sufficiently inhibited, the light-emitting devices based on the halophosphate phosphors obtained in examples 1 and 2 in which the elution of chlorine ions was inhibited exhibited a high luminous flux maintenance rate (%) and inhibited a decrease in luminous flux in the light-emitting devices over time.

The halophosphate phosphor of the disclosure has excellent durability when used in a light-emitting device. In particular, the halophosphate phosphor can be utilized in illumination light sources, LED displays, backlight light sources for liquid crystals, traffic signals, illuminated switches, various sensors, various indicators, small-sized strobes, and the like which use light-emitting diodes as excitation light sources and have extremely excellent light emission characteristics.

What is claimed is:

1. A halophosphate phosphor comprising:
a halophosphate comprising
   an alkaline earth metal comprising at least calcium;
   europium; and
   a halogen comprising at least chlorine, wherein
an elution amount of chlorine ions after the halophosphate phosphor is brought into contact with 10 times by mass of pure water at 85° C. for five hours is 7 ppm or less.

2. The halophosphate phosphor according to claim 1, further comprising:
a phosphate comprising europium, wherein
given 100 as a maximum diffraction intensity of the halophosphate phosphor in an X-ray diffraction spectrum, an integrated value of diffraction intensity in a 2θ range of 29° or more and 30° or less is in a range of 68 or more and 78 or less.

3. The halophosphate phosphor according to claim 1, wherein the halophosphate has a composition such that, given 6 as a number of moles of phosphorus, a number of moles of calcium is in a range of 5.7 or more and 10.1 or less, a number of moles of strontium is in a range of 0 or more and 2.1 or less, a number of moles of europium is in a range of 0.09 or more and 2.1 or less, and a number of moles of halogen is in a range of 1.9 or more and 2.1 or less.

4. The halophosphate phosphor according to claim 1, wherein the halophosphate has a composition represented by Formula (1):

$$(Ca_{1-x-y}Sr_xEu_y)_z(PO_4)_6Cl_w \tag{1}$$

where
x, y, z, and w satisfy $0 \leq x \leq 0.21$, $0.009 < y \leq 0.21$, $9 \leq z \leq 11$, and $1.9 \leq w \leq 2.1$, and
Cl is optionally partially substituted with at least one selected from the group consisting of F and Br.

5. A light-emitting device comprising:
a wavelength conversion member comprising the halophosphate phosphor according to claim 1; and
a light-emitting element having a light emission peak wavelength in a range of 400 nm or more and 460 nm or less.

* * * * *